(12) United States Patent
Takahashi

(10) Patent No.: US 6,624,083 B2
(45) Date of Patent: Sep. 23, 2003

(54) METHOD FOR REMOVING CONTAMINANT COMPOUNDS RESPECTIVELY HAVING BENZENE RING THEREIN FROM SURFACE OF SI LAYER AND METHOD FOR PRODUCING SEMICONDUCTOR DEVICE INCLUDING STEP FOR REMOVING CONTAMINANT COMPOUNDS

(75) Inventor: Masahiro Takahashi, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/907,595

(22) Filed: Jul. 19, 2001

(65) Prior Publication Data

US 2001/0044215 A1 Nov. 22, 2001

Related U.S. Application Data

(62) Division of application No. 09/197,490, filed on Nov. 23, 1999, now Pat. No. 6,287,991.

(30) Foreign Application Priority Data

Apr. 2, 1998 (JP) .............................. 10-90366

(51) Int. Cl.[7] .............................. H01L 21/302
(52) U.S. Cl. ....................... 438/725; 118/666
(58) Field of Search .................. 438/725; 118/50.1

(56) References Cited

U.S. PATENT DOCUMENTS 3,890,176 A 6/1975 Bolon
4,999,280 A * 3/1991 Hiraoka ......................... 57/80
5,334,332 A 8/1994 Lee
5,457,269 A 10/1995 Schonberg
5,780,363 A 7/1998 Delehanty et al.
5,950,101 A 9/1999 Yano et al.
6,319,321 B1 * 11/2001 Hiraga et al. .............. 118/50.1

FOREIGN PATENT DOCUMENTS

JP 5-102069 4/1993
JP 8-250720 9/1996

OTHER PUBLICATIONS

Encyclopedia of Chemical Technology, 3rd, vol. 20, Kirk–Othmer, John Wiley & Sons, New York, 1982, pp. 962–963.

C.D. MacPherson et al., Toluene interactions with the 7X7 and sputtered SI(111) surfaces: evidence of methyl–induced and oxygen–enhanced dissociation pathways, Surface Science 326, Jan. 1995, pp. 141–149.

* cited by examiner

Primary Examiner—William David Coleman
(74) Attorney, Agent, or Firm—Volentine Francos, PLLC

(57) ABSTRACT

A method for removing contaminant compounds respectively having a benzene ring therein from the surface of an Si layer, the method containing enter a step for causing the Si layer to contact with the air, oxygen or ozone under a heated condition or a step for causing the Si layer to contact with a mixture of sulfuric acid and hydrogen peroxide or a mixture of pure water and ozone. The method can be applicable to methods for providing a field effect transistor.

14 Claims, 14 Drawing Sheets

1-(phenyl thio)-1-(trimethylsilyl)-2 propene (trimethysilyl) adamantone

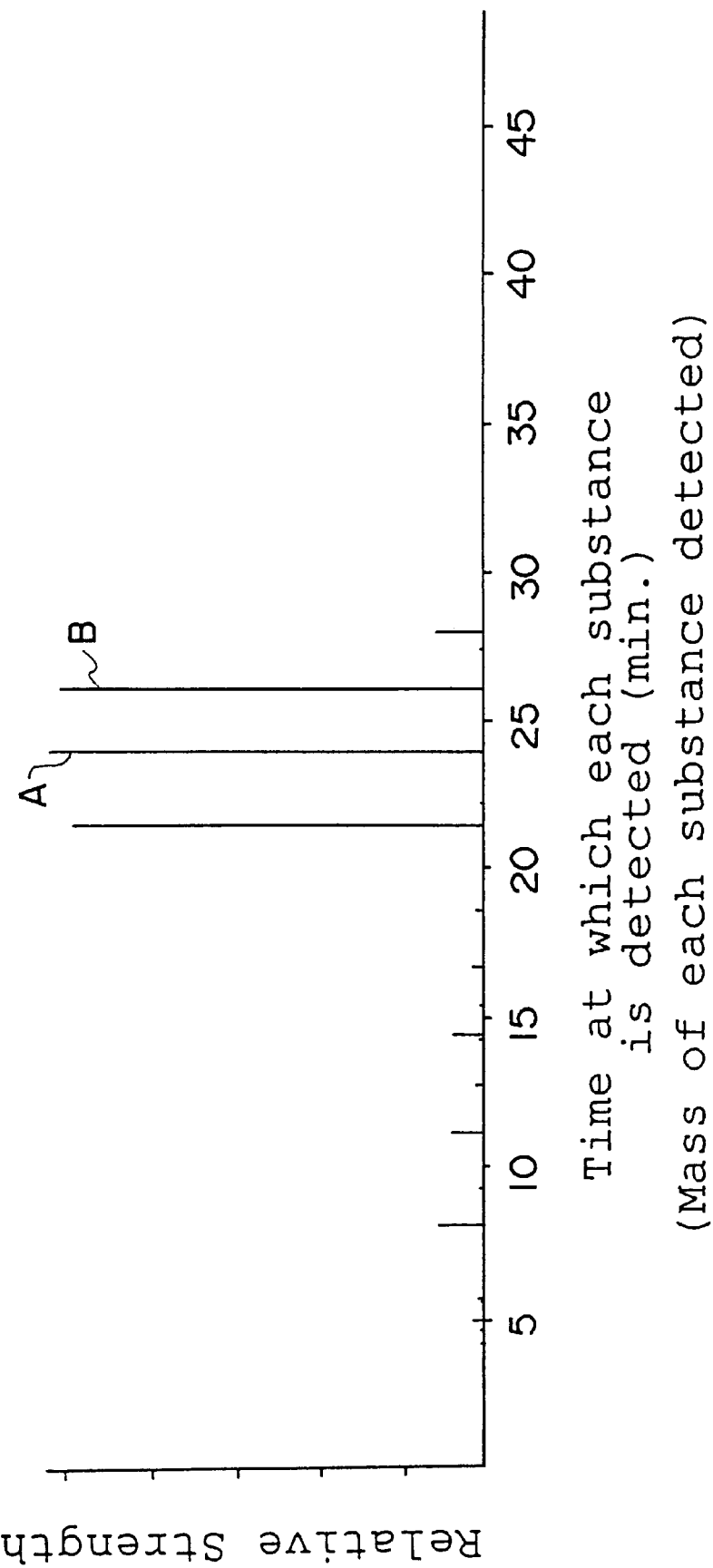

1-(phenyl thio)-1-(trimethylsilyl)-2 propene (trimethysilyl) adamantone

METHOD FOR REMOVING CONTAMINANT COMPOUNDS RESPECTIVELY HAVING BENZENE RING THEREIN FROM SURFACE OF SI LAYER AND METHOD FOR PRODUCING SEMICONDUCTOR DEVICE INCLUDING STEP FOR REMOVING CONTAMINANT COMPOUNDS

CROSS REFERENCE TO RELATED APPLICATIONS

This is a divisional application of application Ser. No. 09/197,490, filed Nov. 23, 1999, now U.S. Pat. No. 6,287,991 which is hereby incorporated by reference in its entirety for all purposes.

FIELD OF THE INVENTION

This invention relates to methods for removing contaminant compounds respectively having a benzene ring therein from the surface of an Si layer and methods for producing semiconductor devices, the methods respectively including one or more steps for removing contaminant compounds respectively having benzene ring therein from the surface of an Si layer.

BACKGROUND OF THE INVENTION

The production processes of a semiconductor device are conducted in a clean room, and the semiconductor wafers are frequently washed with pure water, because contaminants such as dusts, mists, and fine particles composed of conductive compound atoms readily jeopardize the property such as the insulation characteristics of the semiconductor devices produced employing the foregoing semiconductor wafers. Unfortunately, however, it is not easy to keep the internal atmosphere of a clean room absolutely clean, and the pure water employed for washing the semiconductor wafers is gradually contaminated. Exemplary contaminants jeopardizing the insulation of a gate insulator layer of a field effect transistor having a gate insulated from a channel layer and/or the insulation of a capacitor are phthalic acid ester which is employed for a draught test of a clean room, dibutyl phthalate which is employed as a plasticizer employable for producing various plastic vessels, boxes, other apparatus or the like, and butyl hydroxy toluene which is employed as a plasticizer employable for producing wafer cases or the like.

For the purpose to identify the contaminants of a contaminated semiconductor wafer before and after a step for producing a gate insulator layer of a field effect transistor, a wafer-heating gas-removing gas chromatography mass spectrometer was employed. FIG. 1 is a gas chromatogram of a gas evaporated from an Si substrate just after being washed with pure water and FIG. 2 is a gas chromatogram of a gas evaporated from an Si substrate on which a gate insulator layer has been produced. It is well known that the Y axis of a chromatogram represents relative strength or detected quantity of a detected compound and the X axis of a chromatogram represents the time at which the foregoing compound was detected or the mass of the compound detected.

For the purpose to identify the contaminants remained unevaporated on an Si water after heating it in $N_2$ gas for 10 minutes, a wafer-heating gas-removing gas chromatography mass spectrometer was employed. FIG. 3 is a gas chromatogram of a gas evaporated from an Si substrate heated at a temperature range of 500° C. through 700° C. in $N_2$ gas for 10 minutes. Benchtop/PBM search results show the substances represented respectively by A and B shown in FIG. 3 are 1-(phenyl thio)-1-(trimethylsilyl)-2-propene and (trimethylsilyl) adamantone respectively having a molecular construction respectively shown in FIG. 4A and in FIG. 4B.

Results of an analysis applied to FIGS. 1, 2 and 3 are itemized below.

1. Major contaminants of an Si wafer under progress of a production process for producing a semiconductor device are compounds each of which has a benzene ring therein.
2. A high temperature process conducted for producing a gate insulator layer is effective to remove some volatile sorts of contaminants from the surface of an Si wafer.
3. A heating process applied to an Si wafer on which a gate insulator layer has been produced, the heating process being conducted at a temperature range of 500° C. through 700° C. in $N_2$ gas for 10 minutes, causes silylyzation to occur for reacting with some of the functional groups alone of the compounds each of which has a benzene ring therein, resultantly converting the compounds to other non-volatile sorts of compounds, such as 1-(phenyl thio)-1-(trimethylsilyl)-2-propene, and trimethylsilyl adamantone.

The above results imply a reaction which cleaves benzene rings of the contaminant compounds respectively having benzene rings therein would convert the contaminant compounds to volatile compounds which can readily be removed from the surface of an Si wafer.

As a matter of fact, since most compounds respectively having a benzene ring therein are conductive, such compound contaminants readily jeopardize the insulation of an insulator layer located between a conductor layer of a semiconductor device e.g. a gate insulator layer of a field effect transistor and an insulator layer composing a capacitor produced in a semiconductor device.

OBJECTS AND SUMMARY OF THE INVENTION

Accordingly, a first object of this invention is to provide a method for removing contaminant compounds each of which has one or more benzene rings therein from the surface of an Si layer.

A second object of this invention is to provide a method for producing a field effect transistor, the method including a step for removing contaminant compounds each of which has one or more benzene rings therein from the surface of an Si layer.

A third object of this invention is to provide a method for producing a semiconductor device containing a capacitor produced therein, the method including a step for removing contaminant compounds each of which has one or more benzene rings therein from the surface of an Si layer.

This invention is based on a concept described below.

1. Major contaminants remaining on an Si wafer after a high temperature process for producing a gate insulator layer are non-volatile compounds respectively having a benzene ring therein, such as 1-(phenyl thio)-1-(trimethylsilyl)-2-propene, trimethylsilyl adamantone and the like.
2. An action to cause an Si wafer having the foregoing contaminants thereon to contact with a gas such as the air, oxygen and ozone under a temperature range of 500° C. through 700° C. or with a liquid such as a mixture of sulfuric acid and hydrogen peroxide and a mixture of pure water and ozone causes silylyzation to occur to cleave some of the benzene rings of the foregoing non-volatile compounds, resultantly converting the non-volatile compounds to chain silyl esters or the like which are volatile.

Accordingly, a first method for removing contaminants from a surface of an Si layer in accordance with this invention comprises:

a step for causing the Si layer to contact with a gas selected from a group of the air, oxygen and ozone under a heated condition, for causing silylyzation to occur for the contaminants to cleave a benzene ring of at least one of the contaminants, during a process for producing a semiconductor device.

It is realistic to conduct the foregoing process during a process for producing a gate insulator layer of a field effect transistor or a process for decompose a silane for depositing an $SiO_2$ layer on an Si layer.

A second method for removing contaminants from a surface of an Si layer comprises:

a step for causing an Si layer to contact with a liquid selected from a group of a mixture of sulfuric acid and hydrogen peroxide and a mixture of pure water and ozone for causing silylyzation to occur for the contaminants to cleave a benzene ring of at least one of the contaminants, during a process for producing a semiconductor device.

It is realistic to conduct the foregoing process during a process for producing a gate insulator layer of a field effect transistor.

A first method for producing a field effect transistor in accordance with this invention includes the foregoing first method for removing contaminants from a surface of an Si layer in accordance with this invention.

A second method for producing a field effect transistor in accordance with this invention includes the foregoing second method for removing contaminants from a surface of an Si layer in accordance with this invention A first method for producing a semiconductor device containing a capacitor therein in accordance with this invention includes the foregoing first method for removing contaminants from a surface of an Si layer in accordance with this invention.

A second method for producing a semiconductor device containing a capacitor therein in accordance with this invention includes the foregoing second method for removing contaminants from a surface of an Si layer in accordance with this invention.

BRIEF DESCRIPTION OF THE DRAWINGS

This invention, together with its various features and advantages, can be readily understood from the following more detailed description presented in conjunction with the following drawings, in which:

FIG. 3 is a gas chromatogram of a gas evaporated from an Si substrate charged in a CVD apparatus which is filled with $N_2$ gas.

DETAILED DESCRIPTION OF THE PREFERRED EMBODIMENTS

Referring to drawings, methods for respectively producing field effect transistors in accordance with a first and second embodiments of this invention and methods for respectively producing field effect transistors attached by a capacitor connected therewith in accordance with a third and fourth embodiments of this invention will be described below.

First Embodiment

A method for producing a field effect transistor, the method containing a step for removing contaminants from a surface of an Si substrate, by causing the Si wafer to contact with the air, oxygen or ozone at a temperature range of 500° C. through 700° C. preferably under a condition in which a silane is available.

Figure 1:
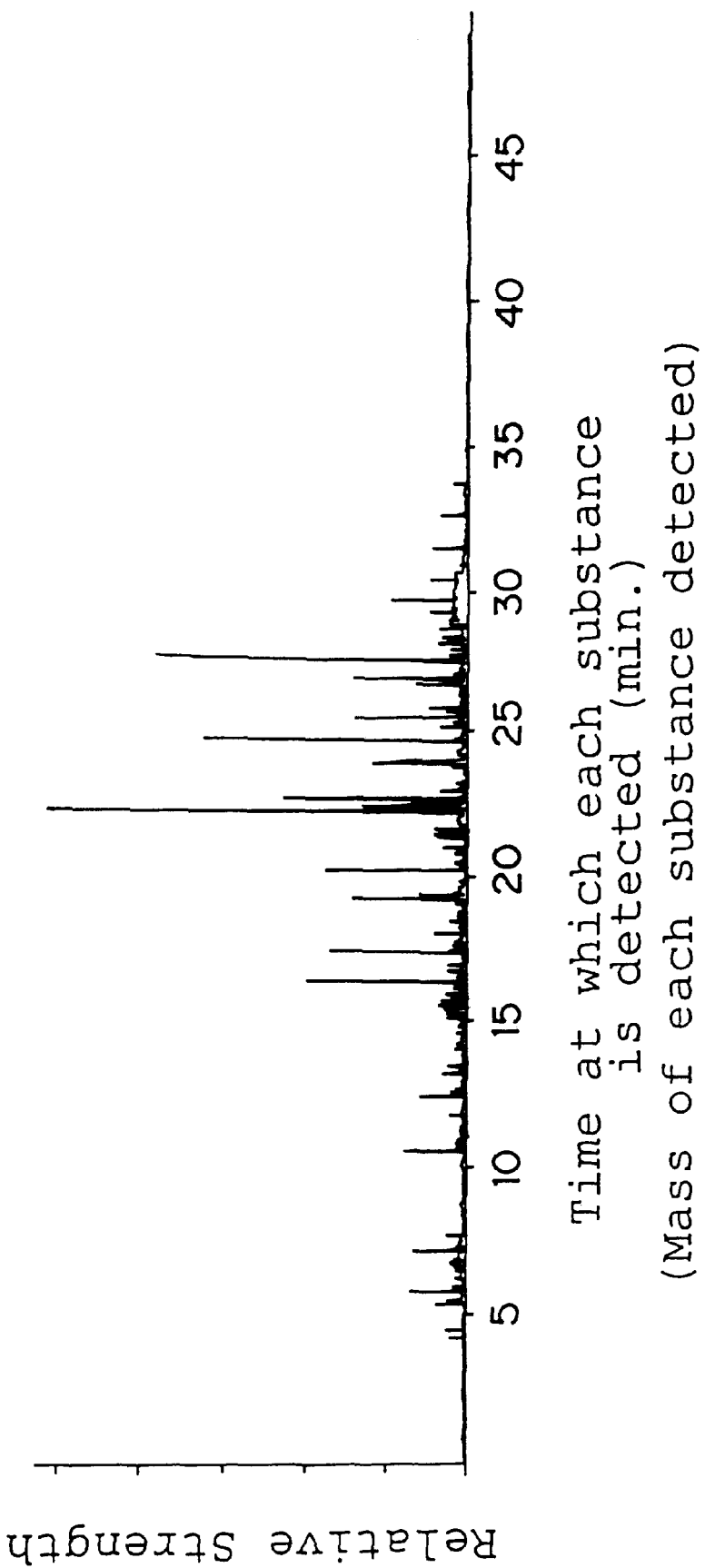
FIG. 1 is a gas chromatogram of a gas evaporated from an Si substrate just after being washed with pure water.
Figure 2:
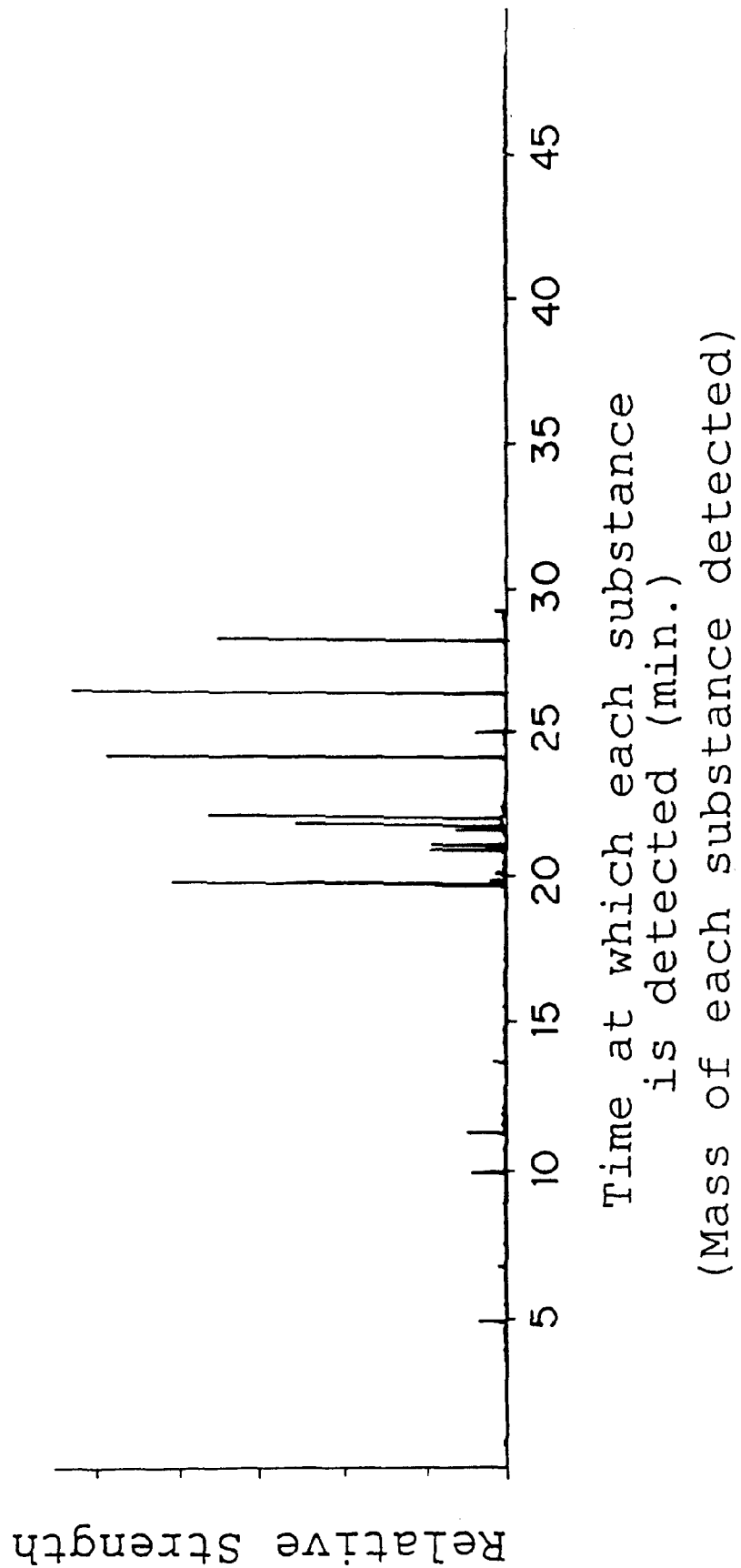
FIG. 2 is a gas chromatogram of a gas evaporated from an Si substrate on which a gate insulator layer is produced.
Figure 4A:
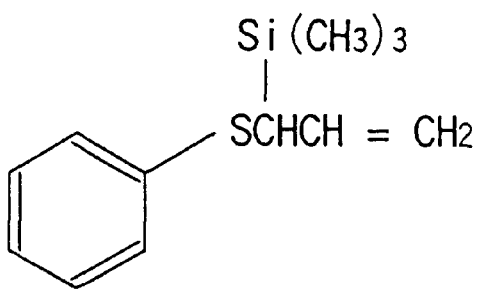
FIGS. 4A and 4B show the results of Benchtop/PBM search for identifying the substances shown as respectively A and B in FIG. 3.
Figure 4B:
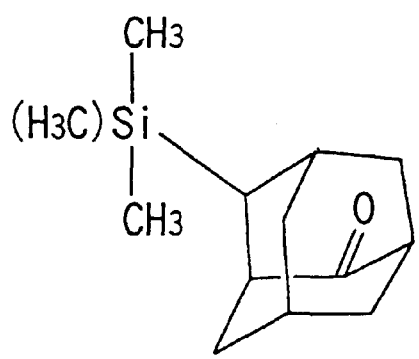
Figure 5:
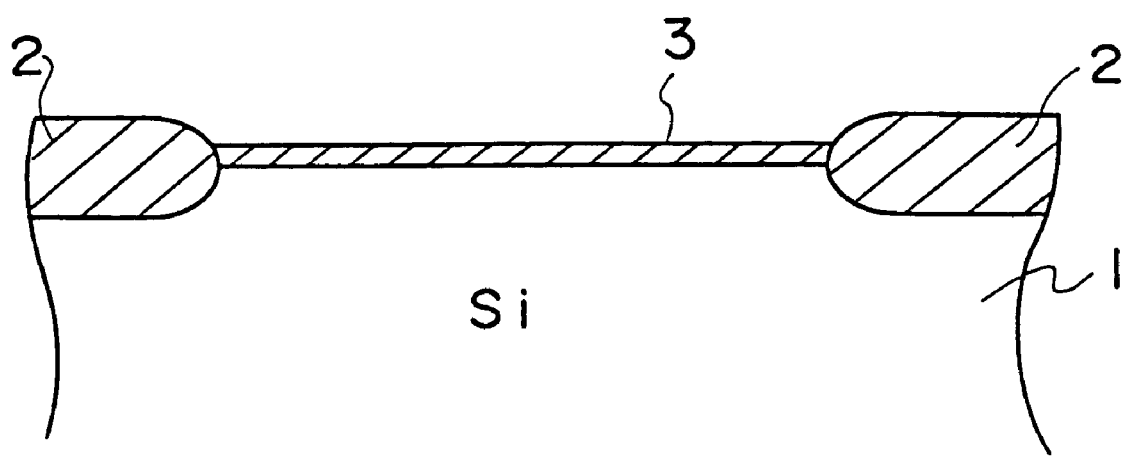
FIG. 5 is a cross section of an Si substrate under a progress for producing a field effect transistor.

Referring to FIG. 5, a selective oxidation process is conducted to produce a field insulator layer 2 surrounding active areas in each of which a field effect transistor is scheduled to be produced, on the surface of an Si substrate 1 containing impurities of one conductivity. After the Si substrate 1 (Hereinafter referred to as an Si wafer under some situation.) is washed with pure water, a wet oxidation process or a pyrogenic oxidation process is conducted to produce a thin $SiO_2$ layer 3.

The Si wafer 1 is charged in a CVD furnace in which a low pressure CVD process is conducted to produce a conductive Si layer 4 (See FIG. 8) on the thin SiO$_2$ layer 3. In the CVD furnace, the Si wafer 1 is allowed to contact with a mixture of the air and a silane e.g. Si H$_4$ at a temperature range of 500° C. through 700° C. for a relatively long time e.g. 10 min.

Figure 6:
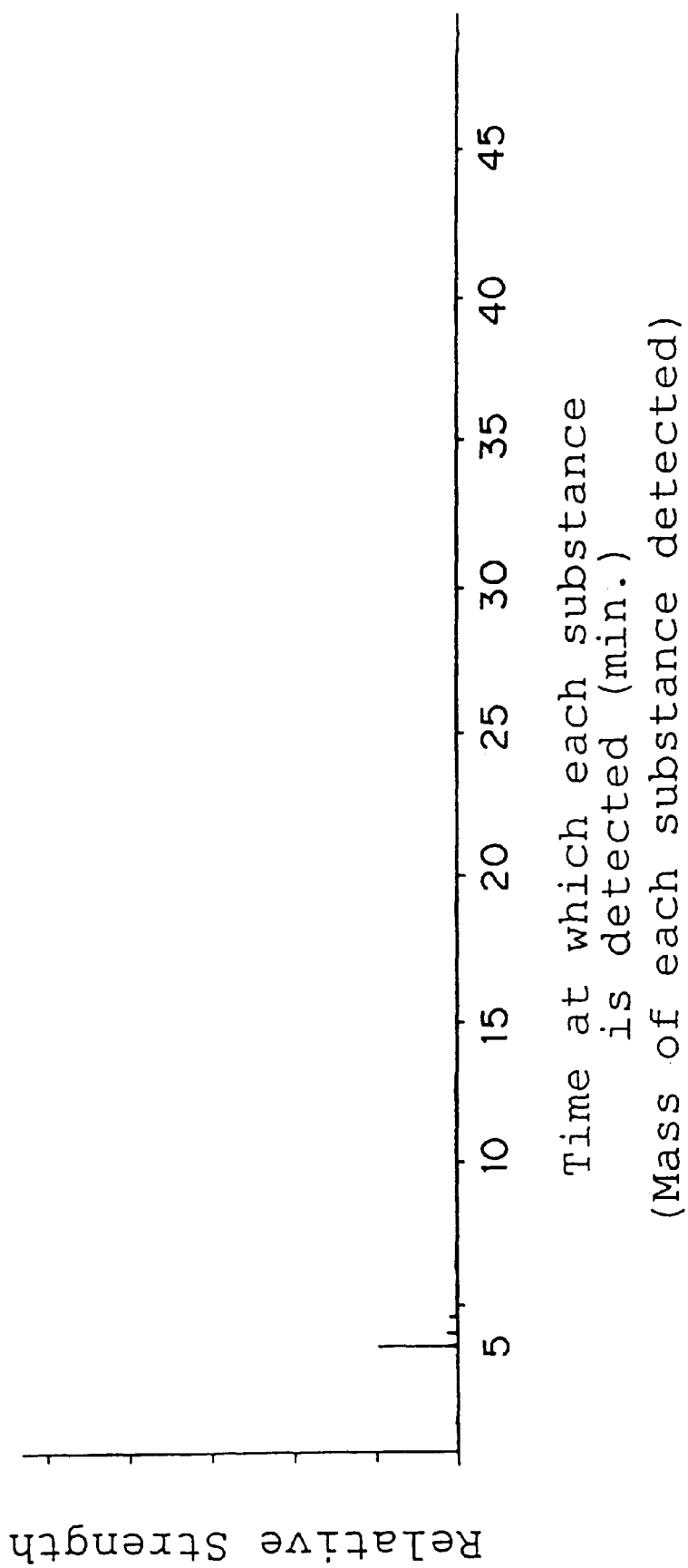
FIG. 6 is a gas chromatogram of a gas evaporated from an Si substrate just after being applied with a process for removing contaminants from a surface of an Si substrate in accordance with the first phase of this invention.

As a result, silylyzation occurs to cleave some of the benzene rings of compounds such as 1-(phenyl thio)-1-(trimethylsilyl)-2-propene, trimethylsilyl adamantone, C$_6$H$_7$SC (Si(CH$_3$)$_3$) HC$_2$H$_3$ or the like, resultantly converting the compounds to 2-piperidinecarborylic acid, 1-(trimethylsilyl)-, trimethylsilyl ester, ethanedioic acid, bis (trimethylsilyl)ester, (CH$_3$)$_3$ SiOCOC (Si(CH$_3$)$_3$) HCOO Si(CH$_3$)$_3$, (CH$_3$)$_3$ Si OCO Si(CH$_3$)$_3$ or the like. Since the latters are volatile, the contaminants are readily removed. FIG. 6 is a gas chromatogram of a gas evaporated from the foregoing Si wafer.

A gas chromatogram of a gas evaporated from the foregoing Si wafer is shown in FIG. 6. In this specification, a process for removing contaminant compounds from the surface of an Si layer by causing the Si layer to contact with the air, oxygen or ozone, is defined as a first phase of this invention.

Figure 7:
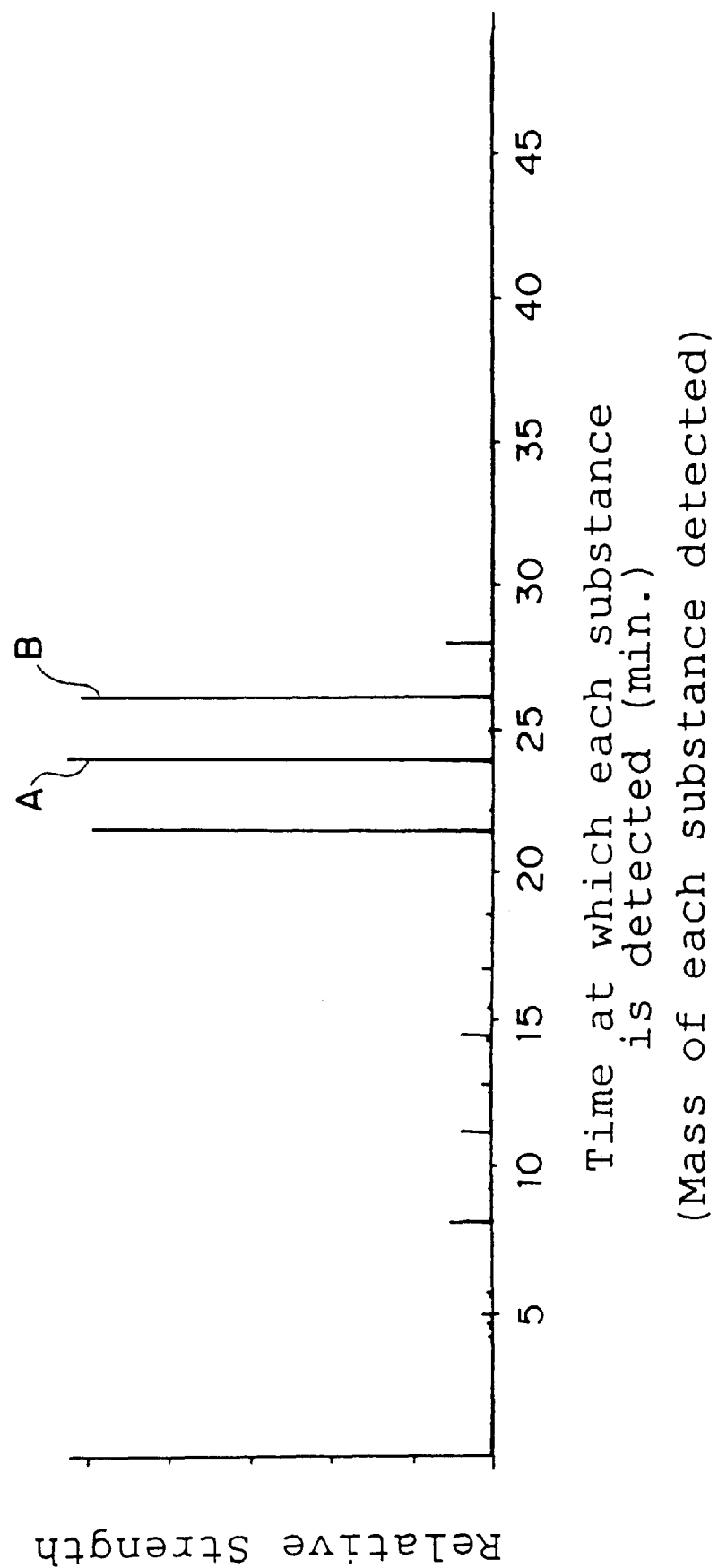
FIG. 7 is a gas chromatogram of a gas evaporated from an Si substrate kept in a CVD apparatus which is filled with $N_2$ gas.

For the purpose of comparison, a gas chromatogram of a gas evaporated from an Si wafer kept in a CVD furnace in which N$_2$ gas is filled, is shown in FIG. 7.

Figure 8:
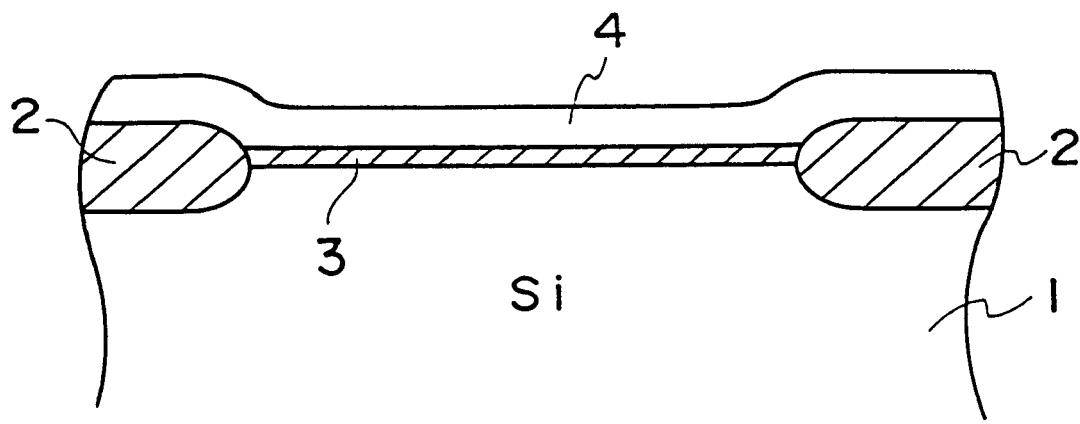
FIG. 8 is a cross section of an Si substrate under a progress for producing a field effect transistor in accordance with this invention.

Referring to FIG. 8, a CVD process is conducted to produce a conductive Si layer 4 on the thin SiO$_2$ layer 3.

Figure 9:
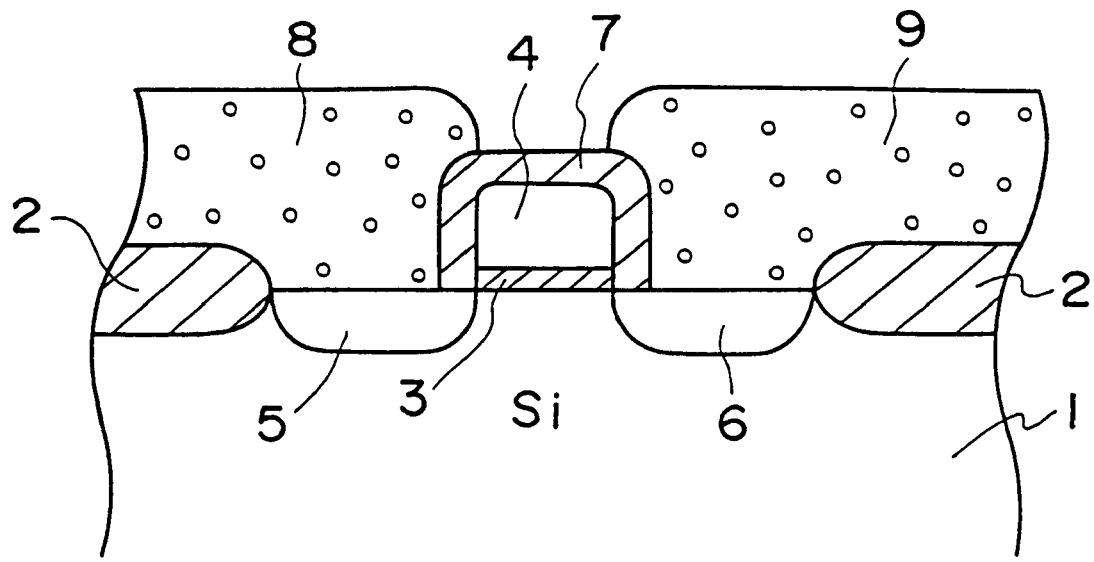
FIG. 9 is a cross section of a field effect transistor produced employing a method in accordance with the first and second embodiments of this invention.

Referring to FIG. 9, a piled layer consisting of the conductive Si layer 4 and the thin SiO$_2$ layer is patterned into a shape of a gate electrode. An ion implantation process is conducted to produce a source 5 and a drain 6 along the top surface of the Si layer 1. A metal layer is produced to cover the Si wafer and the metal layer is patterned into shapes of a source electrode 8 and a drain electrode 9.

Figure 10:
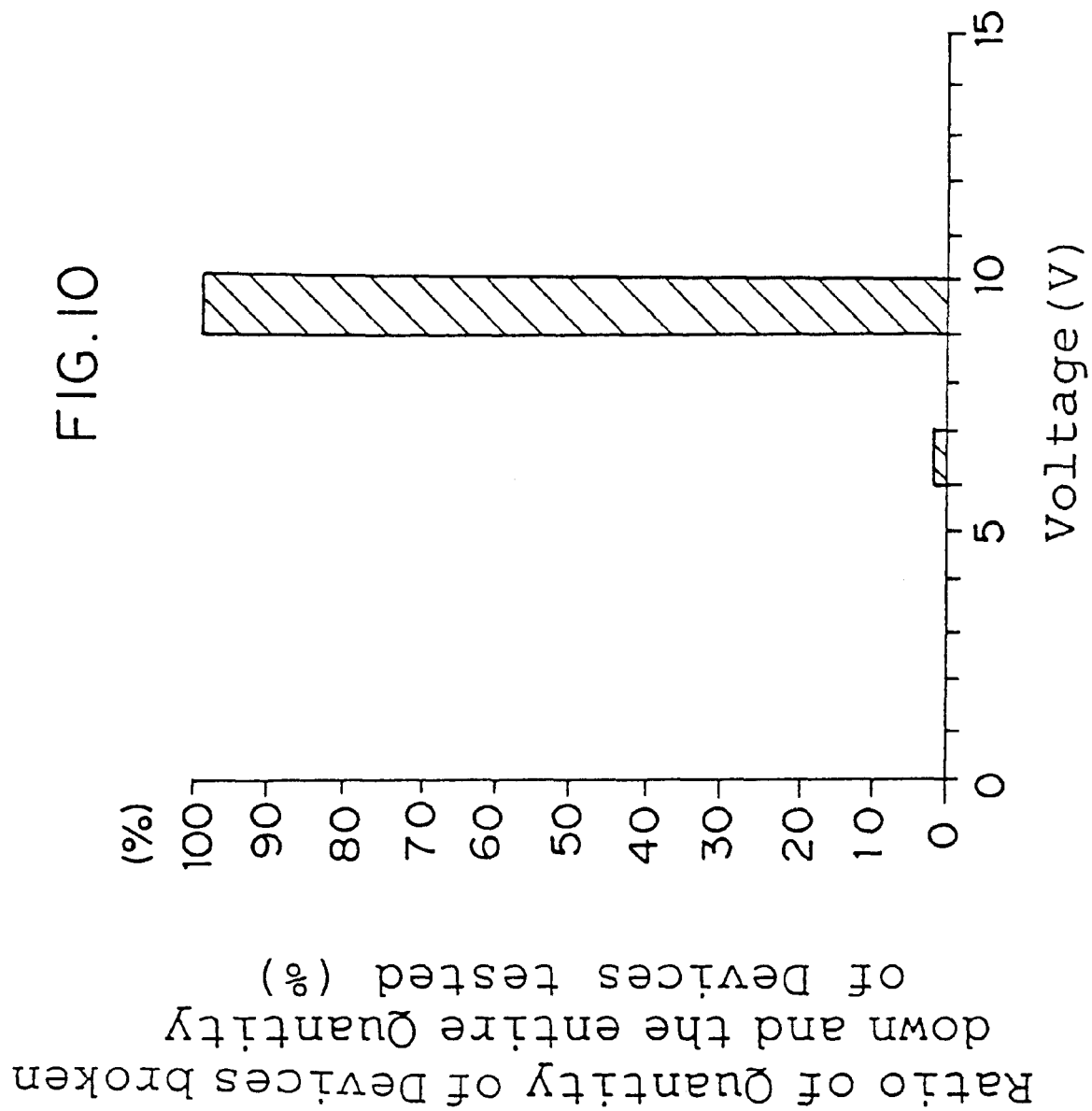
FIG. 10 is a histogram showing a result of a dielectric strength test conducted for field effect transistors produced employing a method in accordance with the first embodiment of this invention.

A dielectric strength test is conducted for plural specimens of the field effect transistor produced in a manner described above. Results of the tests are shown in a histogram shown in FIG. 10. Nearly 100% of the specimens show a satisfactory result.

Figure 11:
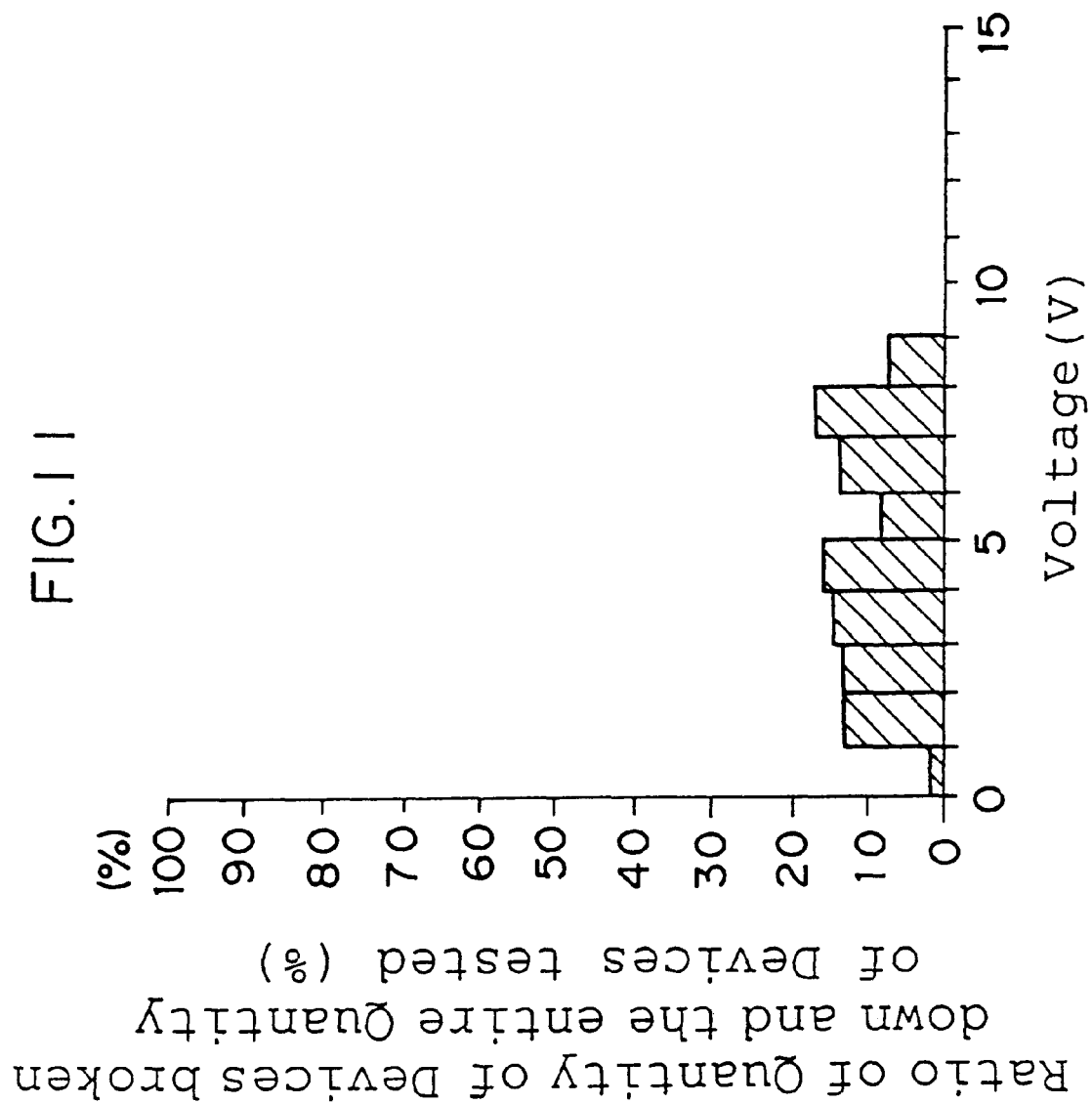
FIG. 11 is a histogram showing a result of a dielectric strength test conducted for field effect transistors produced employing Si wafers kept in $N_2$ gas for 10 minutes.

For the purpose of comparison, plural field effect transistors are produced employing Si wafers which were kept for a while in a CVD furnace in which N$_2$ gas is filled. A gas chromatogram of a gas evaporated from the Si wafer is shown in FIG. 7. A dielectric strength test is conducted for the foregoing plural field effect transistors produced employing Si wafers which were kept for a while in a CVD furnace in which N$_2$ gas is filled. Results of the tests are shown in FIG. 11. It is clear the results are entirely unsatisfactory.

Plural experiments have been conducted to prove that the process in which an Si wafer is contacted with the air at a temperature range of 500° C. through 700° C. preferably in a CVD furnace in which some quantity of a silane may remain, can be replaced by a similar process in which an Si wafer is contacted with oxygen or ozone under similar conditions. It is noted that the length of period required for removing the contaminants is shortened, in each of the foregoing cases. The magnitude of the time shortening effect is remarkable in the case of ozone. In reality, a period of 5 through 10 minutes is enough for the case of oxygen and a period of 3 through 5 minutes is enough for the case of ozone.

Further, it is proved that the process for removing contaminant compounds from a surface of an Si layer can be effectively conducted before a process for producing a thin SiO$_2$ layer. In other words, the process for removing contaminant compounds from a surface of an Si layer can be conducted either before or after a process for producing an insulator layer of which the insulation is required to be improved.

Second Embodiment

A method for producing a field effect transistor, the method containing a step for removing contaminants from a surface of an Si substrate, by causing an Si layer to contact with a mixture of sulfuric acid and hydrogen peroxide or a mixture of pure water and ozone.

Referring to FIG. 5 again, a selective oxidation process is conducted to produce a field insulator layer 2 surrounding active areas in each of which a field effect transistor is scheduled to be produced, on the surface of an Si substrate 1 containing impurities of one conductivity. After the Si substrate or the Si wafer 1 is washed with pure water, a wet oxidation process or a pyrogenic oxidation process is conducted to produce a thin SiO$_2$ layer 3.

The Si wafer is contacted with a liquid which is a mixture of sulfuric acid and hydrogen peroxide or a mixture of pure water and ozone. As a result, silylyzation occurs to cleave some of the benzene rings of compounds such as 1-(phenyl thio)-1-(trimethylsilyl)-2-propene, trimethylsilyl adamantone, C$_6$H$_7$SC (Si(CH$_3$)$_3$) HC$_2$H$_3$ or the like, resultantly converting the compounds to 2-piperidinecarborylic acid, 1-(trimethylsilyl)-, trimethylsilyl ester, ethanedioic acid, bis(trimethylsilyl)ester, (CH$_3$)$_3$ SiOCOC (Si(CH$_3$)$_3$) HCOO Si(CH$_3$)$_3$, (CH$_3$)$_3$ Si OCO Si(CH$_3$)$_3$ or the like. Since the latters are volatile, the contaminants are readily removed.

To prove the effect for removing the contaminant compounds from a surface of an Si layer, gas chromatography tests were conducted respectively for an Si wafer just after being washed with pure water, for an Si wafer after a gate insulator layer is produced and for an Si wafer after a process for causing an Si wafer to contact with a mixture of sulfuric acid and hydrogen or a mixture of pure water and ozone.

Figure 12:
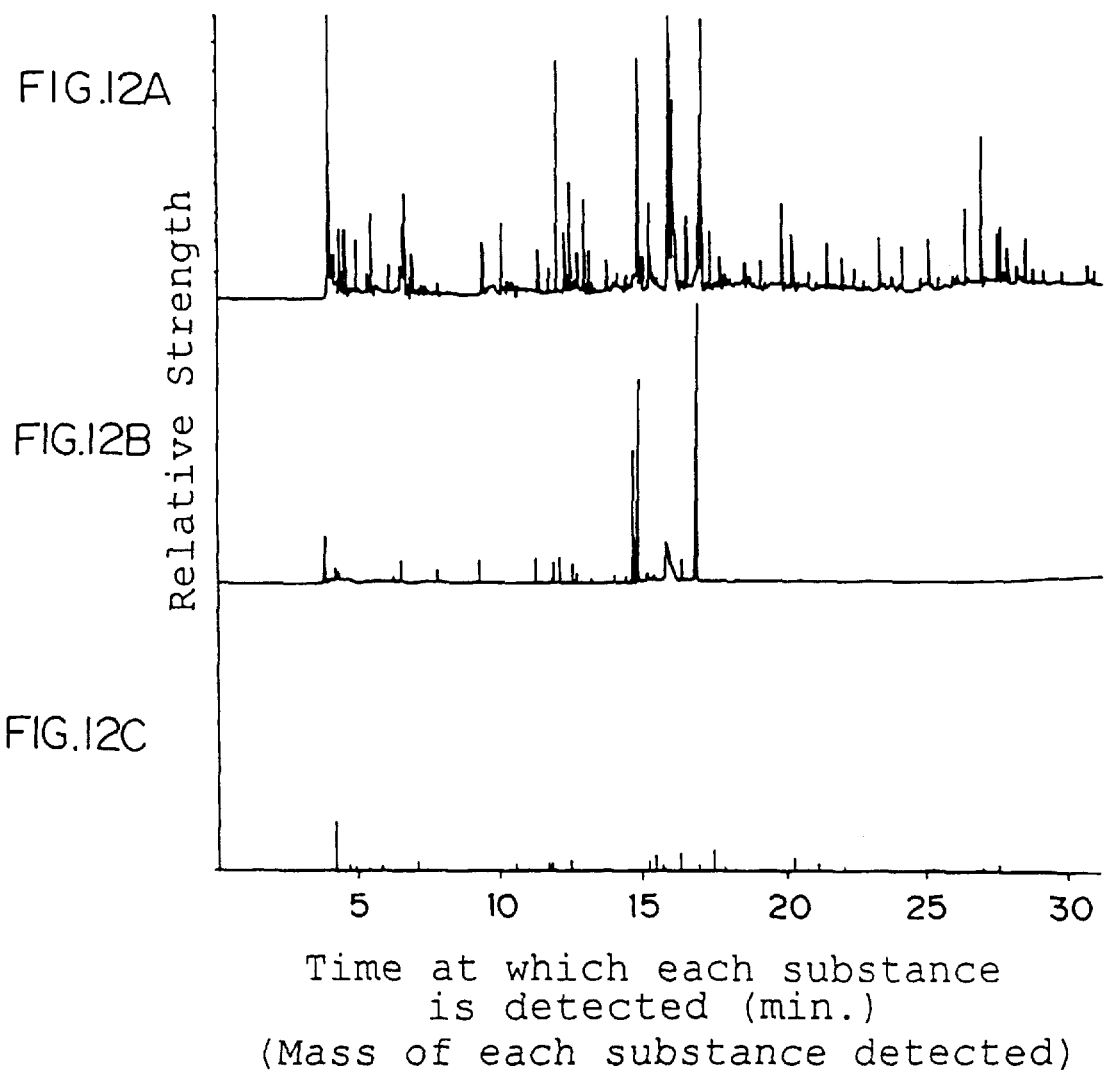
FIGS. 12A, 12B, and 12C, are respectively a gas chromatogram of a gas evaporated from an Si wafer just after being washed with pure water, a gas chromatogram of a gas evaporated from an Si wafer after a gate insulator layer is produced and a gas chromatogram of a gas evaporated from an Si wafer after a process for causing the Si wafer to contact with a mixture of sulfuric acid and hydrogen peroxide or a mixture of pure water and ozone in accordance with the second embodiment of this invention.

Referring to FIGS. 12A, B and C, a gas chromatogram of a gas evaporated from the Si wafer just after being washed with pure water is shown in FIG. 12A, a gas chromatogram of a gas evaporated from the Si wafer after a gate insulator layer is produced is shown in FIG. 12B and a gas chromatogram of a gas evaporated from the Si wafer after a process for causing an Si wafer to contact with a mixture of sulfuric acid and hydrogen peroxide or a mixture of pure water and ozone is shown in FIG. 12C. It is clear from FIG. 12C that nearly 100% of the contaminants are removed by a process specific to this invention.

Referring again to FIG. 8, a CVD process is conducted to produce a conductive Si layer 4 on the thin SiO$_2$ layer 3.

Referring to FIG. 9, a piled layer consisting of the conductive Si layer 4 and the thin SiO$_2$ layer is patterned into a shape of a gate electrode. An ion implantation process is conducted to produce a source 5 and a drain 6 along the top surface of the Si layer 1. A metal layer is produced to cover the Si wafer and the metal layer is patterned into shapes of a source electrode 8 and a drain electrode 9.

In the foregoing manner, a field effect transistor having a gate insulator layer of which the magnitude of insulation is improved, is successfully produced.

Figure 13:
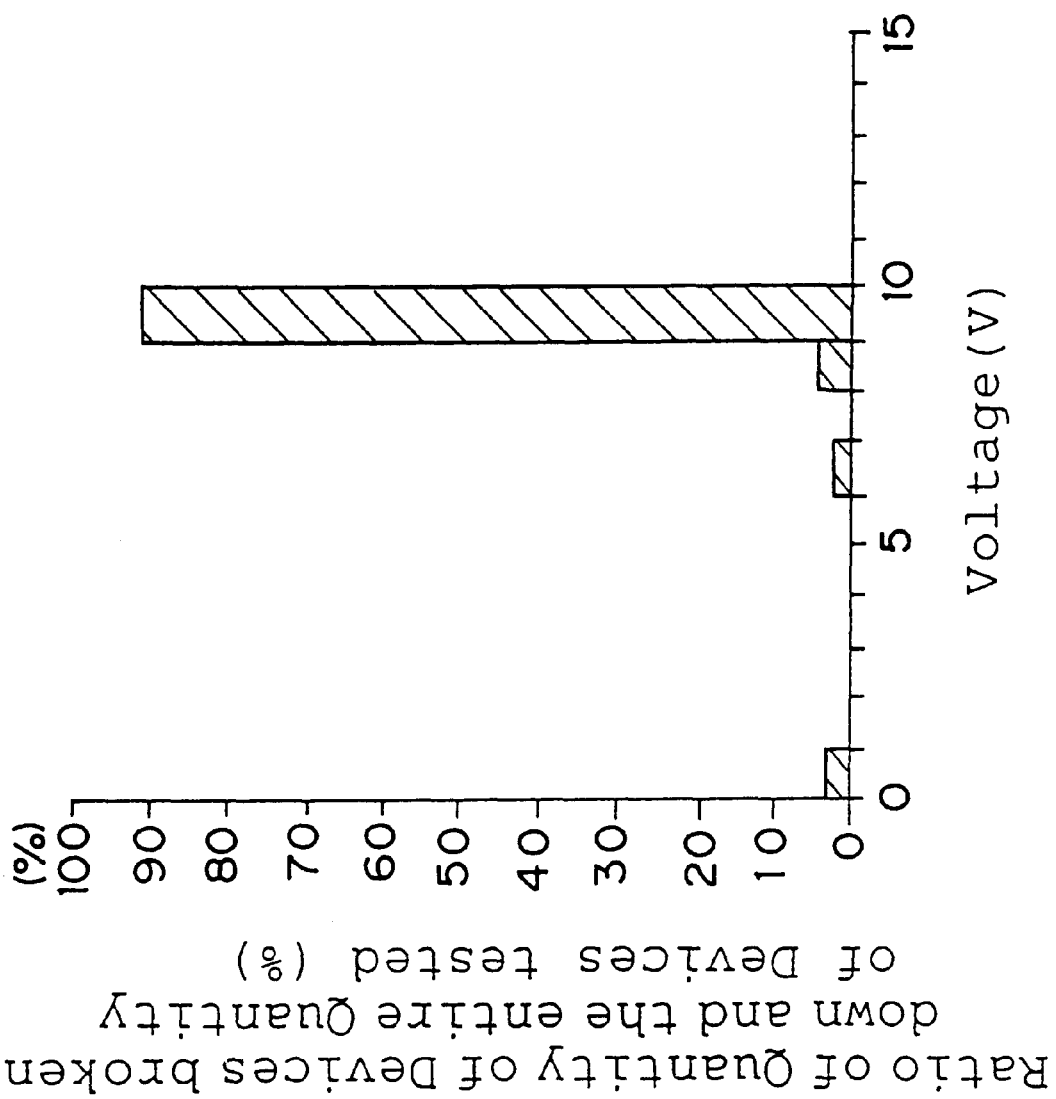
FIG. 13 is a histogram showing a result of a dielectric strength conducted for field effect transistors produced employing a method in accordance with the second embodiment of this invention.

Dielectric strength tests are conducted for a group of field effect transistors produced in the foregoing manner. Results of the tests are shown in a histogram shown in FIG. 13. Nearly 100% of the specimens show a satisfactory result.

Figure 14:
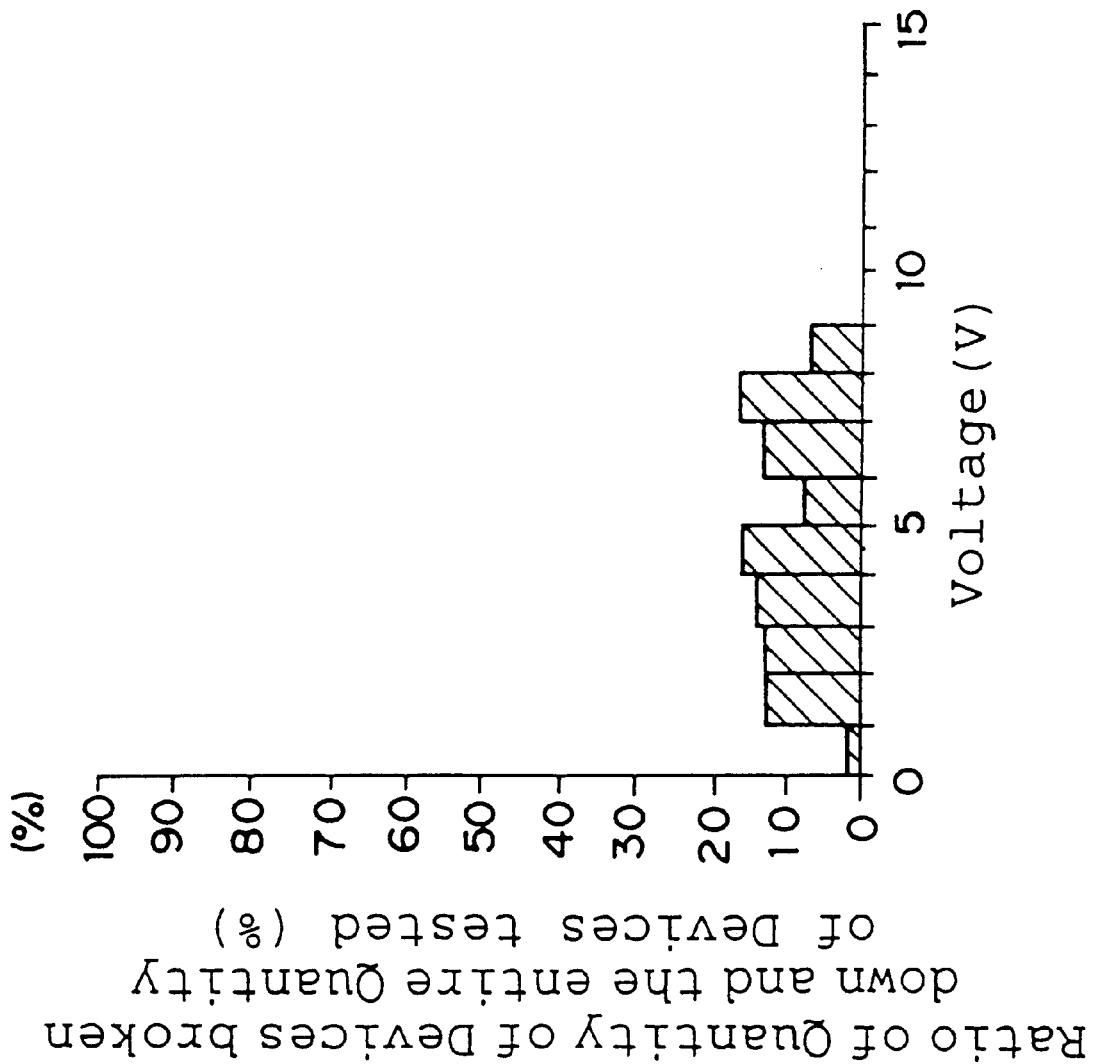
FIG. 14 is a histogram showing a result of a dielectric strength conducted for field effect transistors produced employing Si wafers for which the process for removing contaminants from the surface of an Si wafer in accordance with this invention is not conducted.

For the purpose of comparison, a group of field effect transistors produced employing Si wafers for which the process for removing contaminants from the surface of an Si wafer in accordance with this invention is not conduced. Dielectric strength tests are conducted for the field effect transistors produced employing Si wafers for which the process for removing contaminants from the surface of an Si wafer in accordance with this invention is not conduced. Results of the tests are shown in FIG. 14. It is clear the results are unsatisfactory.

Plural experiments have been conducted to prove that the process in which an Si wafer is contacted with a mixture of sulfuric acid and hydrogen peroxide or a mixture of pure water and ozone can be conducted either before or after a process for producing an insulator layer of which the insulation is required to be improved.

Third Embodiment

A method for producing a field effect transistor attached by a capacitor connected therewith, the method containing a step for removing contaminants from a surface of an Si substrate, by causing an Si layer to contact with the air, oxygen or ozone at a temperature range of 500° C. through 700° C. preferably under a condition in which a silane is available.

Referring again to FIGS. 5 and 8, a process similar to that which was employed for the first and second embodiments is employed to produce a field effect transistor.

Figure 15:
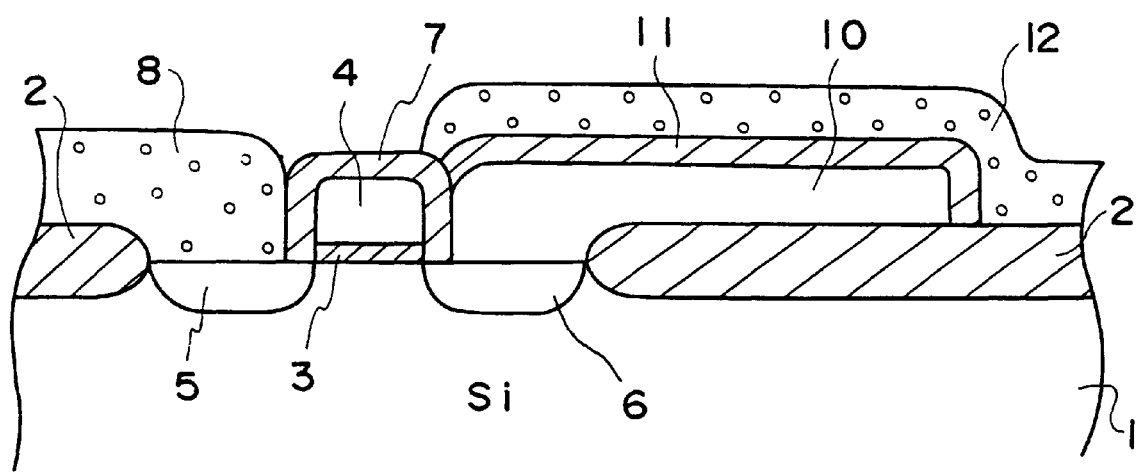
FIG. 15 is a cross section of a field effect transistor attached by a capacitor connected therewith in accordance with the third and fourth embodiments of this invention.

Referring to FIG. 15, after the gate electrode 4 is covered by an insulator layer 7, a contact hole is produced only for the drain 6. A doped poly cryslaline Si layer is produced on top of the Si substrate 1, which is patterned into a shape of a first electrode 10 of a capacitor. An SiO₂ layer is produced to cover the first electrode 10, before a metal layer is produced on the entire surface of the Si wafer 1. The metal layer is patterned to shapes of a source electrode 8 and a second electrode 12 of the capacitor.

When the field effect transistor composes a memory cell having a one transistor one capacitor structure, the second electrode 12 of the capacitor is grounded, and the gate electrode 4 works as a word line and the source electrode 8 is connected with a bit line.

During the foregoing process, a process for causing an Si wafer to contact with the air, oxygen or ozone at a temperature range of 500° C. through 700° C. is conducted either before or after the process for producing an insulator layer 3 or 11, for the purpose to remove contaminants from the surface of the Si wafer. When the process is conducted for producing a gate electrode 4, it is preferable to conduct the process in a CVD furnace which is employed for producing the gate electrode 4.

Further, it is proved that the length of period required for removing contaminants is remarkably shortened, when oxygen particularly ozone is employed rather than the air as the active gas.

In the foregoing manner, a field effect transistor attached by a capacitor connected therewith having a gate insulator layer and an insulator layer of the capacitor of which the insulation is improved, is successfully produced.

Results similar to those of the first embodiments of this invention have been experimentally proved.

Fourth Embodiment

A method for producing a field effect transistor attached by a capacitor connected therewith, the method containing a step for removing contaminants from a surface of an Si substrate by causing an Si layer to contact with a mixture of sulfuric acid and hydrogen peroxide or a mixture of pure water and ozone.

Referring to FIG. 5 for the fourth time, a process similar to that which was employed for the third embodiment is employed to produce a field effect transistor attached by a capacitor connected therewith.

During the foregoing process, a process for causing an Si wafer to contact with a mixture of sulfuric acid and hydrogen peroxide or a mixture of pure water and ozone, for the purpose to remove contaminants from the surface of the Si wafer. When the process is conducted for producing a gate electrode 4, it is preferable to conduct the process in a CVD furnace which is employed for producing the gate electrode 4.

In the foregoing manner, a field effect transistor attached by a capacitor connected therewith having a gate insulator layer and an insulator layer of the capacitor of which the insulation is improved, is successfully produced.

Results similar to those of the second embodiments of this invention have been experimentally proved.

The foregoing description has clarified that methods for removing contaminant compounds respectively having a benzene ring therein from the surface of an Si layer and methods for producing semiconductor devices, the methods respectively including one or more steps for removing contaminant compounds respectively having benzene ring therein from the surface of an Si layer, have been successfully provided by this invention.

What is claimed is:

1. A method for removing organic material from a surface of an Si oxide gate insulating layer during fabrication of a field effect transistor, said method comprising:

providing a semiconductor substrate, having the Si oxide gate insulating layer formed thereon, in a chamber having residual unreacted silane gas and entrainment oxygen;

silylating the organic material on the surface of the Si oxide gate insulating layer by reacting the organic material with the residual unreacted silane gas and the entrainment oxygen within the chamber;

removing the silylated organic material from the surface of the Si oxide gate insulating layer by evacuating the chamber;

forming a polysilicon gate layer on the Si oxide gate insulating layer within the chamber.

2. The method in accordance with claim 1, wherein a temperature range within the chamber during said silylating of the organic material is 500° C. to 700° C.

3. A method for removing organic material from a surface of an Si oxide gate insulating layer during fabrication of a field effect transistor, said method comprising:

providing a semiconductor substrate, having the Si oxide gate insulating layer formed thereon, in a chamber;

introducing a gas selected from a group of air, oxygen and ozone into the chamber;

silylating the organic material on the surface of the Si oxide gate insulating layer by reacting the organic material with the gas selected from the group of air, oxygen and ozone within the chamber;

removing the silylated organic material from the surface of the Si Oxide gate insulating layer by evacuating the chamber;

forming a polysilicon gate layer on the Si oxide gate insulating layer within the chamber.

4. A method for removing organic material from a surface of an Si oxide gate insulating layer during fabrication of a field effect transistor, said method comprising:

providing a semiconductor substrate, having the Si oxide gate insulating layer formed thereon, in a chamber;

introducing a gas selected from a group of air, oxygen and ozone into the chamber;

silylating the organic material on the surface of the Si oxide gate insulating layer by reacting the organic material with the gas selected from the group of air, oxygen and ozone within the chamber;

removing the silylated organic material from the surface of the Si oxide gate insulating layer by evacuating the chamber;

forming a polysilicon gate layer on the Si oxide gate insulating layer within the chamber;

wherein a temperature range within the chamber during said silylating of the organic material is 500° C. to 700° C.

5. A method for removing organic material from a surface of an Si oxide capacitor dielectric layer during fabrication of a capacitor, said method comprising:

providing a semiconductor substrate, having the Si oxide capacitor dielectric layer formed thereon, in a chamber having residual unreacted silane gas and entrainment oxygen;

silylating the organic material on the surface of the Si oxide capacitor dielectric layer by reacting the organic material with the residual unreacted silane gas and the entrainment oxygen within the chamber;

removing the silylated organic material from the surface of the Si oxide capacitor dielectric layer by evacuating the chamber;

forming a polysilicon capacitor electrode layer on the Si oxide capacitor dielectric layer within the chamber.

6. The method in accordance with claim 5, wherein a temperature range within the chamber during said silylating of the organic material is 500° C. to 700° C.

7. A method for removing organic material from a surface of an Si oxide capacitor dielectric layer during fabrication of a capacitor, said method comprising:

providing a semiconductor substrate, having the Si oxide capacitor dielectric layer formed thereon, in a chamber;

introducing a gas selected from a group of air, oxygen and ozone into the chamber;

silylating the organic material on the surface of the Si oxide capacitor dielectric layer by reacting the organic material with the gas selected from the group of air, oxygen and ozone within the chamber;

removing the silylated organic material from the surface of the Si oxide capacitor dielectric layer by evacuating the chamber;

forming a polysilicon capacitor electrode layer on the Si oxide capacitor dielectric layer within the chamber.

8. The method in accordance with claim 7, wherein a temperature range within the chamber during said silylating of the organic material is 500° C. to 700° C.

9. A method for fabricating a semiconductor device in which a gate electrode is formed on a gate oxide by introducing silane gas into a reactive furnace chamber, the method comprising:

inserting a semiconductor substrate, on which the gate oxide is formed, into the reactive furnace chamber;

holding the semiconductor substrate in the reactive furnace chamber in an atmosphere of a mixture of silane gas and a gas including oxygen atoms for a predetermined period;

evacuating the reactive furnace chamber; and forming the gate electrode on the gate oxide.

10. The method in accordance with claim 9, wherein an organic material on the gate oxide, the organic material including a benzene ring, is decomposed into straight chain ester during the holding of the semiconductor substrate in the reactive furnace.

11. The method in accordance with claim 9, wherein said gas including oxygen atoms is selected from the group consisting of air, oxygen and ozone.

12. The method in accordance with claim 10, wherein said gas including oxygen atoms is selected form the group consisting of air, oxygen and ozone.

13. The method in accordance with claim 9, wherein said gas including oxygen atoms is air that flows into the reactive furnace chamber when the semiconductor substrate is inserted into the reactive furnace chamber.

14. The method in accordance with claim 10, wherein said gas including oxygen atoms is air that flows into the reactive chamber when the semiconductor substrate is inserted into the reactive furnace chamber.

* * * * *